United States Patent
Kang

(10) Patent No.: US 8,149,633 B2
(45) Date of Patent: Apr. 3, 2012

(54) SEMICONDUCTOR MEMORY DEVICE

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/185,043

(22) Filed: Jul. 18, 2011

(65) Prior Publication Data

US 2011/0273924 A1 Nov. 10, 2011

Related U.S. Application Data

(62) Division of application No. 12/265,988, filed on Nov. 6, 2008, now Pat. No. 8,014,214.

(30) Foreign Application Priority Data

Nov. 8, 2007 (KR) .................. 10-2007-0113665
Sep. 26, 2008 (KR) .................. 10-2008-0094573

(51) Int. Cl.
*G11C 7/00* (2006.01)
*G11C 8/00* (2006.01)

(52) U.S. Cl. ......... 365/189.07; 365/189.09; 365/189.11; 365/201; 365/226

(58) Field of Classification Search ............. 365/189.07, 365/189.09, 189.11, 201, 226

See application file for complete search history.

(56) References Cited

U.S. PATENT DOCUMENTS

| | | | | | |
|---|---|---|---|---|---|
| 5,249,155 | A | * | 9/1993 | Arimoto et al. | 365/201 |
| 5,553,025 | A | * | 9/1996 | Haraguchi | 365/201 |
| 5,986,959 | A | * | 11/1999 | Itou | 365/226 |
| 6,058,061 | A | * | 5/2000 | Ooishi | 365/226 |
| 6,418,075 | B2 | * | 7/2002 | Shimano et al. | 365/189.09 |
| 6,424,585 | B1 | * | 7/2002 | Ooishi | 365/226 |
| 6,487,133 | B2 | * | 11/2002 | Wada et al. | 365/189.09 |
| 6,606,274 | B2 | * | 8/2003 | Ooishi et al. | 365/226 |
| 6,853,593 | B1 | * | 2/2005 | Bae | 365/189.09 |
| 6,891,766 | B2 | * | 5/2005 | Choi et al. | 365/189.09 |
| 6,940,777 | B2 | * | 9/2005 | Ooishi | 365/226 |
| 7,315,478 | B2 | * | 1/2008 | Do | 365/189.09 |
| 7,580,306 | B2 | * | 8/2009 | Cho | 365/189.09 |
| 7,602,664 | B2 | * | 10/2009 | Kang | 365/226 |

* cited by examiner

*Primary Examiner* — Trong Phan
(74) *Attorney, Agent, or Firm* — IP & T Group LLP

(57) ABSTRACT

A semiconductor memory device is provided which includes a voltage detecting unit configured to compare a target voltage level with a fed-back internal voltage to output a detection signal in a normal mode, a driving unit configured to selectively drive an internal voltage terminal to a first or second power supply voltage according to an operation mode in response to the detection signal, and an enable control unit configured to control the driving unit in response to a control signal corresponding to the operation mode.

13 Claims, 4 Drawing Sheets

SEMICONDUCTOR MEMORY DEVICE

CROSS-REFERENCE TO RELATED APPLICATIONS

This application is a division of U.S. patent application Ser. No. 12/265,988 filed on Nov. 6, 2008, now U.S. Pat. No. 8,014,214, which claims priority of Korean patent application number 10-2007-0113665 and 10-2008-0094573, filed on Nov. 8, 2007, and Sep. 26, 2008. The disclosure of each of the foregoing applications is incorporated herein by reference in its entirety.

BACKGROUND OF THE INVENTION

The invention relates to a design for a semiconductor memory device, and more particularly, to a semiconductor memory device operating with a test voltage received through an external pad in a burn-in test mode.

Generally, semiconductor memory devices including a double data rate synchronous DRAM (DDR SDRAM) undergo several test modes before production. Among these test modes, a burn-in test mode is a test mode that screens weak memory cells by applying a stress to memory cells storing data. The memory cells screened through the burn-in test mode can be replaced with redundancy cells in the subsequent process, thus fabricating high-quality semiconductor memory devices.

FIG. 1 is a circuit diagram of a conventional memory cell.

Referring to FIG. 1, a memory cell includes a cell transistor TR and a cell capacitor C.

The cell transistor TR forms a source-drain path between a bit line BL and the cell capacitor C, and has a gate connected to a word line WL to receive a back bias voltage VBB. Thus, when the word line WL is enabled, the cell transistor TR serves to transfer data between the cell capacitor C and the bit line BL.

The cell capacitor C is connected between the cell transistor TR and a cell plate voltage (VCP) terminal. Thus, the cell capacitor C serves to store data transferred through the cell transistor TR.

Meanwhile, the burn-in test mode is a test mode that applies a stress to a semiconductor memory device. That is, a pumping voltage applied to the word line WL, a precharging voltage applied to the bit line BL, a back bias voltage VBB, and a cell plate voltage VCP in the burn-in test mode are higher than those in a normal mode. In this way, a stress is applied to the memory cell. In the normal mode, the precharging voltage and the cell plate voltage VCP have half the voltage level of a core voltage.

In this way, higher voltages are applied in the burn-in test mode than in the normal mode. These high voltages are generally input through external pads. Since the aim of the burn-in test mode is to apply the stress to the memory cell, an internal voltage generator provided in the semiconductor memory device maintains a disabled state.

FIG. 2 is a block diagram for explaining external pads used in the burn-in test mode. Not all pads used in the normal mode are used in the burn-in test mode. Instead, a minimal number of pads are used.

Referring to FIG. 2, the semiconductor memory device includes first to fourth banks 210A to 210D, a wafer burn-in (WBI) pad 230, a test voltage supply pad 250, an address pad 270, and a power supply pad 290.

Each of the first to fourth banks 210A to 210D includes a plurality of memory cells for storing data.

The WBI pad 230 receives a burn-in test signal TM_WBI for entering a burn-in test mode, and the semiconductor memory device determines whether to enter the burn-in test mode according to the burn-in test signal TM_WBI. The burn-in test signal TM_WBI is input through a sixth pad 6.

The test voltage supply pad 250 receives a voltage for applying the stress to the memory cell. The first pad 1 receives a pumping test voltage TM_VPP higher than a pumping voltage in the normal mode, and the second pad 2 receives a core test voltage TM_VCORE higher than a core voltage in the normal mode. The third and fourth pads 3 and 4 receive first and second test voltages TM_V1 and TM_V2 to be used in the test mode, and the fifth pad 5 receives a back bias test voltage TM_VBB lower than the back bias voltage VBB in the normal mode.

The address pad 270 receives signals corresponding to internal commands of the semiconductor memory device and includes seventh to ninth pads 7 to 9. That is, the semiconductor memory device can perform eight internal operations according to first to third test mode signals TM1 to TM3 input through the seventh to ninth pads 7 to 9. The burn-in test mode can be divided into three cases. The semiconductor memory device can perform the eight internal operations according to the three cases.

The power supply pad 290 includes a tenth pad 10 for receiving a ground voltage VSS and an eleventh pad 11 for receiving an external power supply voltage VDD.

The burn-in test mode will be described below with reference to FIGS. 1 and 2. The burn-in test mode can be divided into three cases. For reference, the first and second test voltages TM_V1 and TM_V2 input through the third and fourth pads 3 and 4 may be the core test voltage TM_VCORE and the ground voltage VSS according to the test mode, respectively.

The first burn-in test mode corresponds to a case where the pumping test voltage TM_VPP is applied to the word line WL. In this case, the stress due to the pumping test voltage TM_VPP higher than in the normal mode is applied to the gate of the cell transistor TR.

The second burn-in test mode corresponds to a case where the ground voltage VSS input through the third pad 3 is applied to an input terminal of the cell capacitor C being a storage node, that is, a lower electrode of the capacitor, and the core test voltage TM_VCORE input through the fourth pad 4 is applied to the cell plate voltage (VCP) terminal, that is, an upper electrode of the capacitor. In this case, a higher potential difference is generated, compared to a logic low data in the normal mode, on both terminals of the cell capacitor C.

The third burn-in test mode corresponds to a case where the core test voltage TM_VCORE input through the third pad 3 is applied to an input terminal of the cell capacitor C, and the ground voltage VSS input through the fourth pad 4 is applied to the cell plate voltage (VCP) terminal. In this case, like the second case, a higher potential difference is generated, compared to a logic high data in the normal mode, on both terminals of the cell capacitor C.

The first burn-in test mode must precede the second burn-in test mode and the third burn-in test mode. That is, the first test voltage TM_V1 input through the third pad 3 is applied to the input terminal of the cell capacitor C through the bit line BL.

Meanwhile, the conventional semiconductor memory device uses eleven external pads to perform the burn-in test mode. That is, a test equipment must allocate at least eleven test pins per the semiconductor memory device in order to perform the burn-in test mode. If the test equipment has one hundred ten test pins, it can test eleven semiconductor memory devices at a time. Generally, if the number of semiconductor memory device that can be tested at a time increases, a total test time necessary to perform the test operation is reduced. In other words, if the number of the pads used in the test mode decreases, a total test time can be reduced, which means the reduction of the product cost.

SUMMARY OF THE INVENTION

Embodiments of the present invention are directed to providing a semiconductor memory device which is capable of reducing the number of pads used in a test mode and performing a desired test operation.

Embodiments of the invention are also directed to providing a semiconductor memory device which is capable of generating a desired test voltage by enabling a portion of an internal voltage generator in a test mode.

In accordance with an aspect of the invention, there is provided a semiconductor memory device, which includes a voltage detecting unit configured to compare a target voltage level with a fed-back internal voltage to output a detection signal in a normal mode, a driving unit configured to selectively drive an internal voltage terminal to a first or second power supply voltage according to an operation mode in response to the detection signal, and an enable control unit configured to control the driving unit in response to a control signal corresponding to the operation mode.

In accordance with another aspect of the invention, there is provided a semiconductor memory device having a normal mode and a test mode, which includes a first internal voltage generator configured to generate a first internal voltage in the normal mode, and to generate a first test voltage by using a test power voltage in the test mode, a second internal voltage generator configured to generate a second internal voltage in the normal mode, and to generate a second test voltage by using the test power voltage in the test mode, and a memory cell configured to receive the first and second test voltages in the test mode.

In accordance with the embodiments of the invention, the number of the pads used in the test mode can be reduced by removing the third and fourth pads (3 and 4 in FIG. 2), which have received the first and second test voltages (TM_V1 and TM_V2), and internally generating the first and second test voltages, which have been separately received from the outside.

DESCRIPTION OF SPECIFIC EMBODIMENTS

Other objects and advantages of the present invention can be understood by the following description, and become apparent with reference to the embodiments of the invention.

Figure 2:
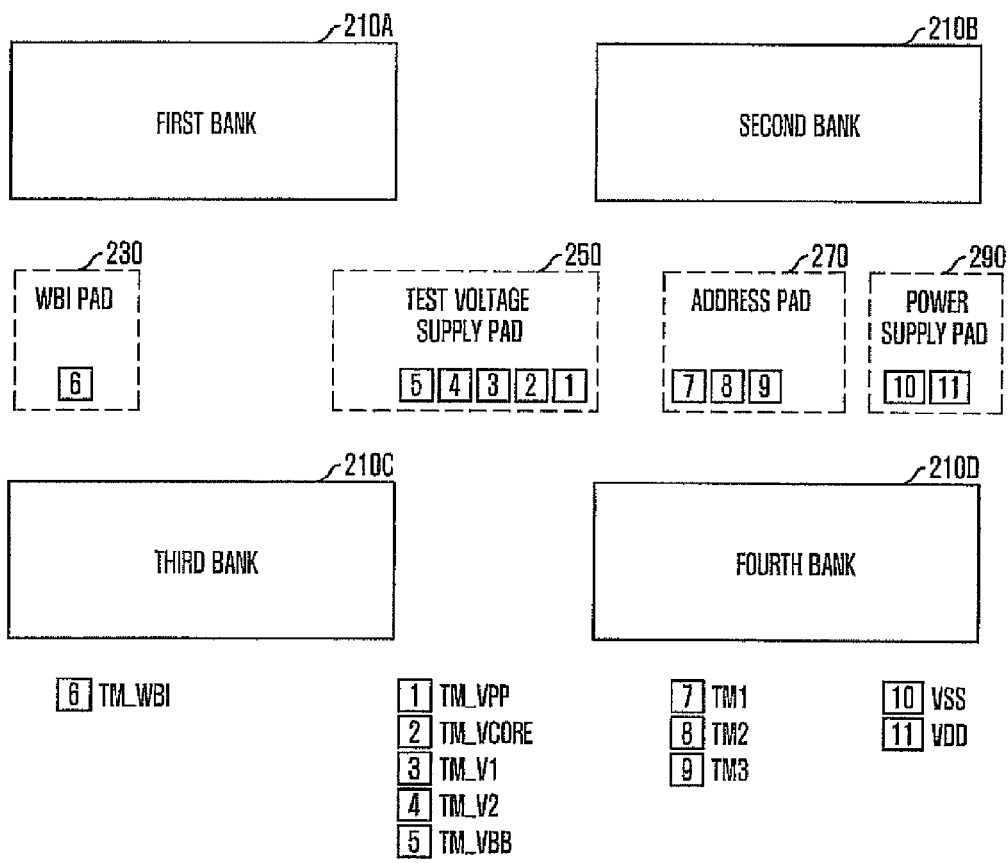
FIG. 2 is a block diagram for explaining external pads used in the burn-in test mode.

The invention can reduce the number of pads used in a test mode by removing the third and fourth pads (3 and 4 in FIG. 2) having received the first and second test voltages TM_V1 and TM_V2.

Meanwhile, the semiconductor memory device includes several internal voltage generators, for example, a precharging voltage generator for generating a precharging voltage (VBLP) used to precharge the bit is line (BL in FIG. 1) and a cell plate bias voltage generator for generating a cell plate voltage (VCP). In accordance with the invention, some components of the precharging voltage generator and the cell plate bias voltage generator are enabled in the test mode to generate the first and second test voltages TM_V1 and TM_V2 necessary for the test mode. The precharging voltage generator and the cell plate bias voltage generator have the similar structure. For convenience, the precharge voltage generator will be described as a representative example.

Figure 3:
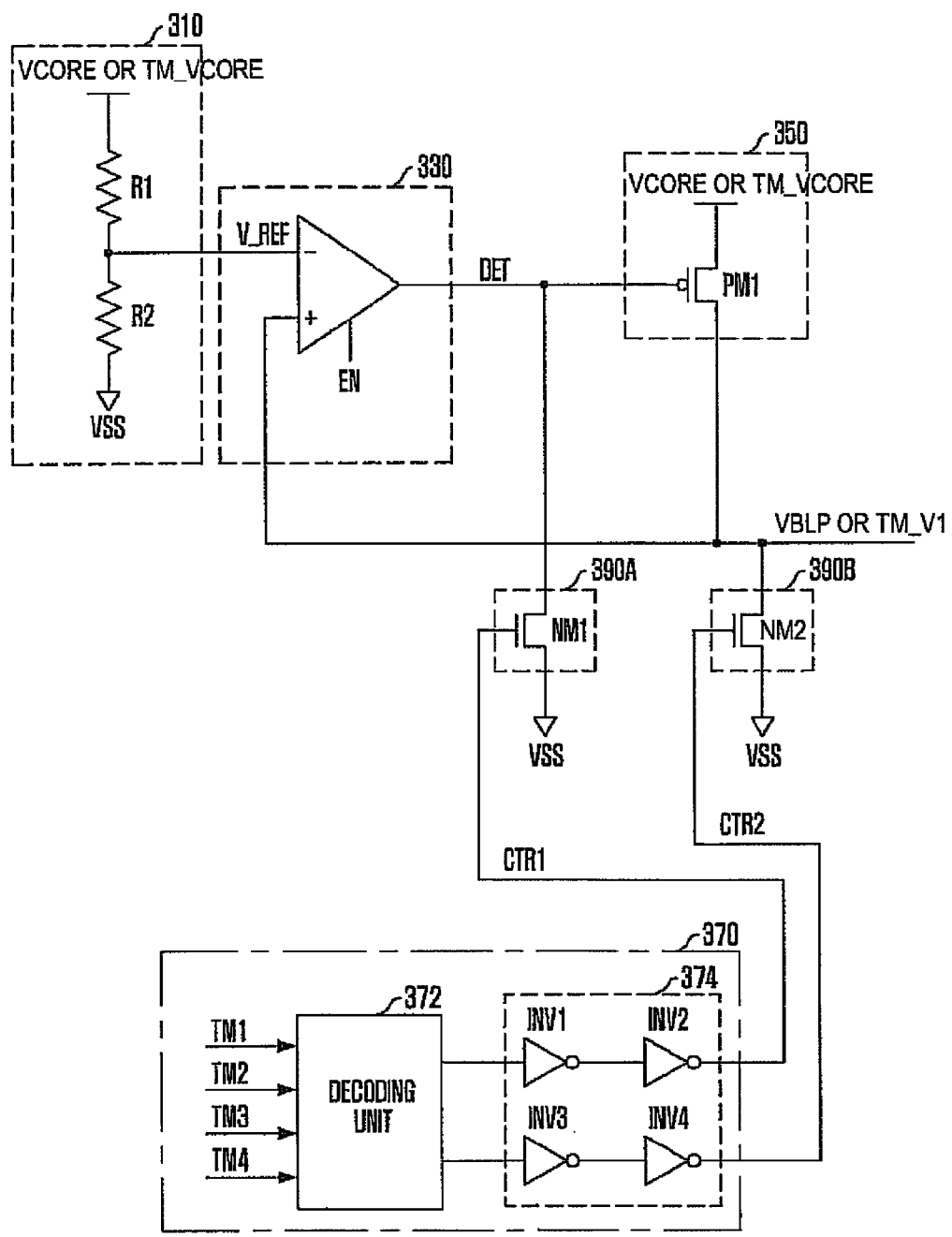
FIG. 3 is a circuit diagram for explaining a precharging voltage generator and its related components in accordance with a first embodiment of the invention.

FIG. 3 is a circuit diagram for explaining a precharging voltage generator and its related components in accordance with a first embodiment of the invention.

Referring to FIG. 3, the precharging voltage generator in accordance with the first embodiment of the invention includes a voltage dividing unit 310, a voltage detecting unit 330, a driving unit 350, a control signal generating unit 370, an enable control unit 390A, and a pull-down driving unit 390B.

The voltage dividing unit 310, the voltage detecting unit 330, and the driving unit 350 are operated in a normal mode to generate a precharging voltage VBLP. In addition, the driving unit 350, the control signal generating unit 370, the enable control unit 390A, and the pull-down driving unit 390B are operated in a test mode to generate a first test voltage TM_V1. For reference, reference symbols indicated by parentheses represent reference symbols corresponding to the test mode.

First, the voltage dividing unit 310, the voltage detecting unit 330, and the driving unit 350 operated in the normal mode will be described below.

The voltage dividing unit 310 generates a reference voltage V_REF corresponding to a target voltage by dividing a core voltage VCORE. The voltage dividing unit 310 may include first and second resistors R1 and R2 connected between a core voltage (VCORE) terminal and a ground voltage (VSS) terminal.

The voltage detecting unit 330 compares the reference voltage V_REF with the precharging voltage VBLP, which is a fed-back internal voltage, to output a detection signal DET. The voltage detecting unit 330 is enabled in response to an enable signal EN. The enable signal EN may contain information on the normal mode and the test mode.

The driving unit 350 drives the precharging voltage (VBLP) terminal to the core voltage VCORE in response to the detection signal DET. The driving unit 350 may include a first PMOS transistor PM1 having a source connected to the core voltage (VCORE) terminal, a drain connected to the precharging voltage (VBLP) terminal, and a gate receiving the detection signal DET.

An operation of generating the precharging voltage VBLP in the normal mode will be first described below.

In the normal mode, the reference voltage V_REF has a voltage level corresponding to a target voltage level. The voltage detecting unit 330 compares the reference voltage V_REF with the precharge voltage VBLP. The voltage detecting unit 330 outputs the detection signal DET of a logic low level when the precharging voltage VBLP is lower than the reference voltage V_REF, and outputs the detection signal DET of a logic high level when the precharging voltage VBLP is higher than the reference voltage V_REF. In this case, the voltage detecting unit 330 is enabled in response to the enable signal EN corresponding to the normal mode.

Meanwhile, the first PMOS transistor PM1 of the driving unit 350 is turned on in response to the detection signal DET of the logic low level, and the precharging voltage VBLP is driven to the core voltage VCORE. Such an operation is performed until the precharging voltage VBLP reaches the target voltage level. If the precharging voltage VBLP rises up to the target voltage level, the first PMOS transistor PM1 is turned off in response to the detection signal DET.

In this case, since the enable control unit 390A is in a disabled state, it has no influence on other circuits in the normal mode.

Next, the driving unit 350, the control signal generating unit 370, the enable control unit 390A, and the pull-down driving unit 390B operated in the test mode will be described below. In the test mode, a core test voltage TM_VCORE higher than a voltage applied in the normal mode is applied to the core voltage (VCORE) terminal, and the first test voltage TM_V1 is output through the precharging voltage (VBLP) terminal.

The control signal generating unit 370 decodes first to fourth test mode signals TM1 to TM4 to generate first and second control signals CTR1 and CTR2, and may include a decoding unit 372 and a control signal output unit 374.

The decoding unit 372 decodes the first to fourth test mode signals TM1 to TM4. The first to fourth test mode signals TM1 to TM4 are signals for generating internal commands. In particular, the fourth test mode signal TM4 is a signal related to the first and second control signals CTR1 and CTR2 for outputting the first test voltage TM_V1 as the core test signal TM_VCORE or the ground voltage VSS according to the test mode. If the necessary internal commands are less than eight cases, the first test voltage TM_V1 can be selected as the core test voltage TM_VCORE or the ground voltage VSS by using the first to third test mode signals TM1 to TM3, except for the fourth test mode TM4.

The control signal output unit 374 receives an output signal of the decoding unit 372 to generate the first and second control signals CTR1 and CTR2, and may include first to fourth inverters INV1 to INV4. The first to fourth inverters INV1 to INV4 are configured to adjust the logic levels of the first and second control signals CTR1 and CTR2 in the test mode, and their structure may be changed according to their design.

The enable control unit 390A enables the driving unit 350 in response to the first control signal CTR1. The enable control unit 390 may include a first NMOS transistor NM1 having a drain connected to the input terminal of the driving unit 350, a source connected to the ground voltage (VSS) terminal, and a gate receiving the first control signal CTR1. The first NMOS transistor NM1 serves to transfer a logic low signal to the driving unit 350 in response to the first control signal CTR1 to thereby enable the driving unit 350.

The pull-down driving unit 390B drives the precharging voltage (VBLP) terminal to the ground voltage VSS in response to the second control signal CTR2. The pull-down driving unit 390E may include a second NMOS transistor NM2 having a drain connected to the precharging voltage (VBLP) terminal, a source connected to the ground voltage (VSS) terminal, and a gate receiving the second control signal CTR2.

Next, an operation of generating the first test voltage TM_V1 in the test mode will be described. The operation of generating the first test voltage TM_V1 may be divided into two cases according to the test mode. The first case is a case where the first test voltage TM_V1 has a voltage level of the core test voltage TM_VCORE, and the second case is a case where the first test voltage TM_V1 has a voltage level of the ground voltage VSS.

In the first case, the first to fourth test signals TM1 to TM4 are decoded so that the first control signal CTR1 becomes a logic high level and the second control signal CTR2 becomes a logic low level. Thus, the first NMOS transistor NM1 is turned on, and the second NMOS transistor NM2 is turned off. Consequently, the first PMOS transistor PM1 of the driving unit 350 is turned on so that the first test voltage TM_V1 has a voltage level corresponding to the core test voltage TM_VCORE.

In the second case, the first to fourth test signals TM1 to TM4 are decoded so that the first control signal CTR1 becomes a logic low level and the second control signal CTR2 becomes a logic high level. Consequently, the second NMOS transistor NM2 of the pull-down driving unit 390E is turned on so that the first test voltage TM_V1 has a voltage level corresponding to the ground voltage VSS.

Meanwhile, the semiconductor memory device in accordance with the current embodiment of the invention may include a cell plate voltage generator (not shown) having a structure similar to that of the precharging voltage generator of FIG. 3. The cell plate voltage generator can generate the cell plate voltage (VCP) in the normal mode and the second test voltage (TM_V2, not shown) in the test mode. The second test voltage TM_V2 may have a voltage corresponding to the core test voltage TM_VCORE or the ground voltage VSS according to the burn-in test mode.

Therefore, when the precharging voltage generator generates the first test voltage TM_V1 corresponding to the core test voltage TM_VCORE, the cell plate voltage generator can generate the second test voltage TM_V2 corresponding to the ground voltage VSS. In addition, when the precharging voltage generator generates the first test voltage TM_V1 corresponding to the ground voltage VSS, the cell plate voltage generator can generate the second test voltage TM_V2 corresponding to the core test voltage TM_VCORE. Such a control operation of the cell plate voltage generator may use the output signals of the first and third inverters INV1 and INV3 provided in the control signal generating unit 370.

Figure 1:
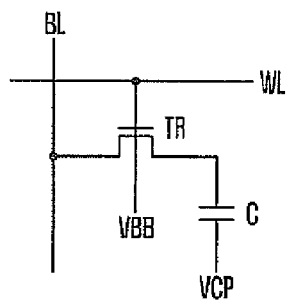
FIG. 1 is a circuit diagram of a conventional memory cell.

The burn-in test mode will be described below with reference to FIGS. 1 and 3. The burn-in test mode may be divided into three cases. Although described later with reference to FIG. 4, the semiconductor memory device in accordance with the current embodiment of the invention can internally generate the first test voltage TM_V1 to be applied to the bit line BL and the second test voltage TM_V2 to be applied to the cell plate bias voltage terminal, instead of receiving them through the external pads.

The first burn-in test mode corresponds to a case where the pumping test voltage TM_VPP is applied to the word line WL. In this case, the stress due to the pumping test voltage TM_VPP, which is higher than voltage applied in the normal mode, is applied to the gate of the cell transistor TR.

The second burn-in test mode can apply the first test voltage TM_V1 corresponding to the ground voltage VSS to the input terminal of the cell capacitor C, and apply the second test voltage TM_V2 corresponding to the core test voltage TM_VCORE to the cell plate voltage (VCP) terminal.

The third burn-in test mode can apply the first test voltage TM_V1 corresponding to the core test voltage TM_VCORE to the input terminal of the cell capacitor C, and apply the second test voltage TM_V2 corresponding to the ground voltage VSS to the cell plate voltage (VCP) terminal.

Figure 4:
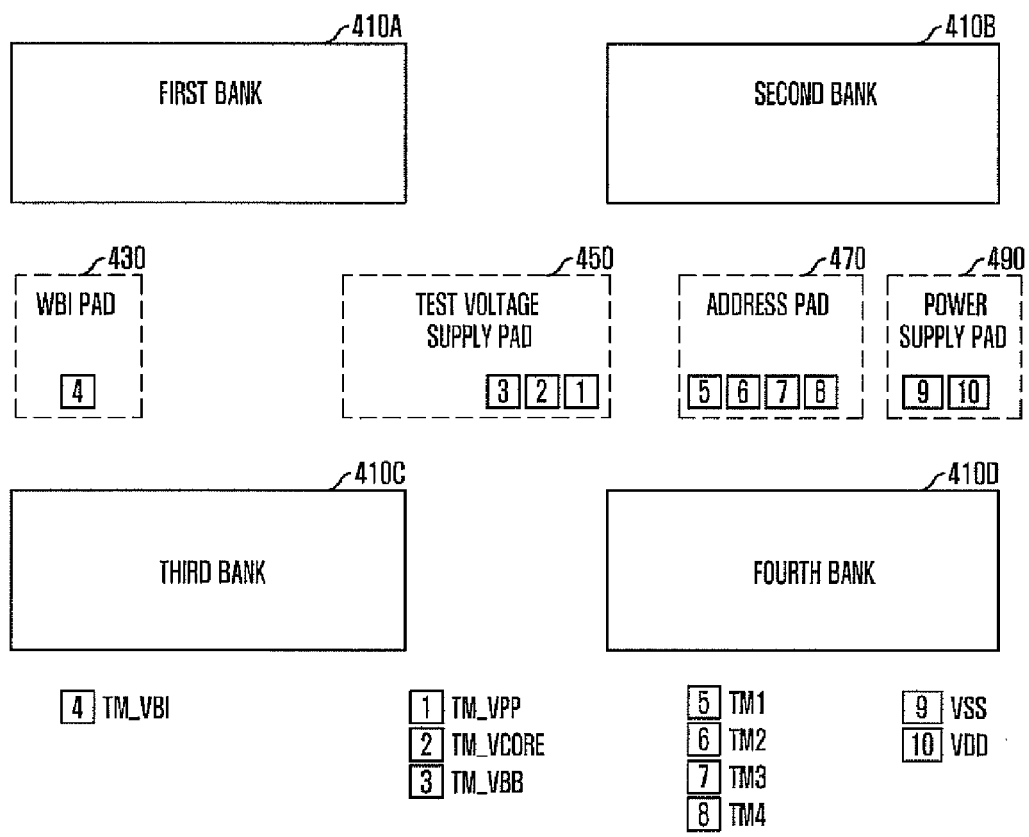
FIG. 4 is a block diagram for explaining the external pads used in the burn-in test mode in accordance with a first embodiment of the invention.

FIG. 4 is a block diagram for explaining the external pads used in the burn-in test mode in accordance with the current embodiment of the invention.

Referring to FIG. 4, the semiconductor memory device includes first to fourth banks 410A to 410D, a wafer burn-in (WBI) pad 430, a test voltage supply pad 450, an address pad 470, and a power supply pad 490.

Each of the first to fourth banks 410A to 410D includes a plurality of memory cells for storing data.

The WBI pad 430 receives a burn-in test signal TM_WBI for entering a burn-in test mode, and the semiconductor memory device determines whether to enter the burn-in test mode according to the burn-in test signal TM_WBI. The burn-in test signal TM_WBI may be input through the fourth pad 4.

The test voltage supply pad 450 receives a voltage for applying a stress to the memory cell. The first pad 1 receives a pumping test voltage TM_VPP higher than a pumping voltage in the normal mode, and the second pad 2 receives a core test voltage TM_VCORE higher than a core voltage in the normal mode. The third pad 3 receives a back bias test voltage TM_VBB lower than a back bias voltage VBB in the normal mode.

The address pad 470 receives signals corresponding to internal commands of the semiconductor memory device and may include fifth to eighth pads 5 to 8. That is, the semiconductor memory device can perform eight internal operations according to first to fourth test mode signals TM1 to TM4 input through the fifth to eighth pads 5 to 8.

The power supply pad 490 may include a ninth pad 9 for receiving the ground voltage VSS and a tenth pad 10 for receiving an external power supply voltage VDD.

The semiconductor memory device in accordance with the current embodiment of the invention can internally generate the first test voltage TM_V1 and the second test voltage TM_V2. Therefore, compared with the semiconductor memory device of FIG. 2, the pads corresponding to the first test voltage TM_V1 and the second test voltage TM_V2 are removed in the semiconductor memory device of FIG. 4. Referring again to FIG. 4, the eighth pad 8 is further provided to select the first test voltage TM_V2 as the core test voltage TM_VCORE or the ground voltage VSS, and to select the second test voltage TM_V2 as the ground voltage VSS or the core test voltage TM_VCORE. However, as described above, this may be added or removed according to the number of the internal commands.

Consequently, even though the eighth pad 8 is included for performing the burn-in test mode, the semiconductor memory device uses ten external pads. If the test equipment has one hundred ten test pins, it can test eleven semiconductor memory devices at a time. This means that more semiconductor memory devices can be tested at a time and a total test time can be reduced, as compared with the related art. Consequently, since the number of the external pads used in the test mode is reduced, at least a total test time required in the test mode and a product cost can be reduced.

Figure 5:
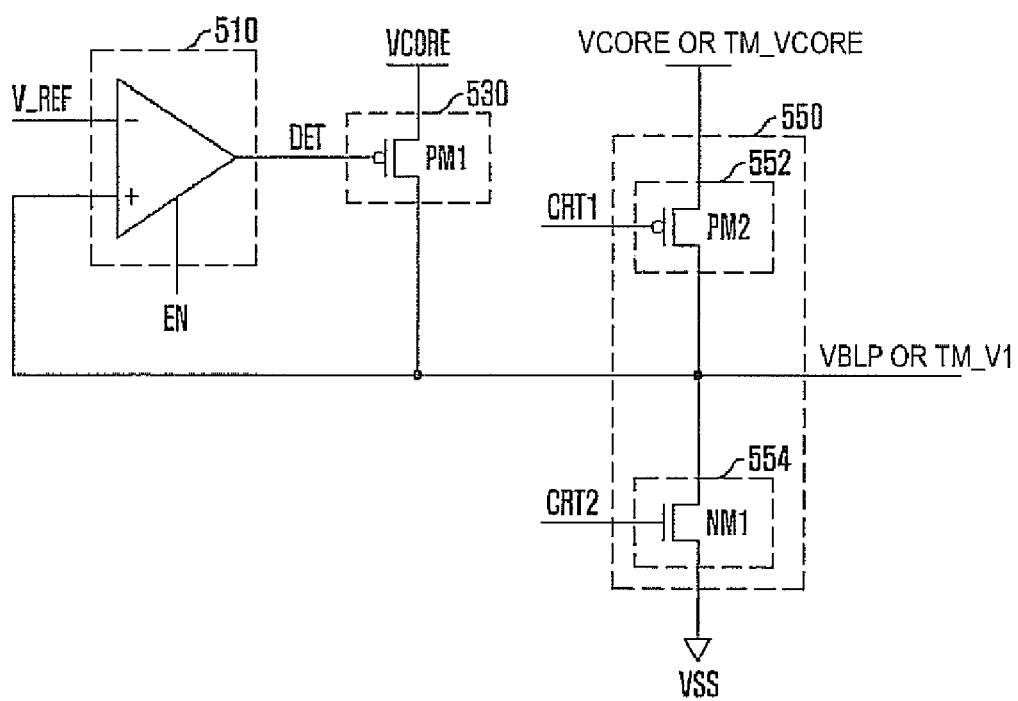
FIG. 5 is a circuit diagram for explaining a semiconductor memory device in accordance with a second embodiment of the invention.

FIG. 5 is a circuit diagram for explaining a semiconductor memory device in accordance with a second embodiment of the invention. For convenience, only a voltage detecting unit 510, a normal mode driving unit 530, and a test mode driving unit 550 connected to the precharging voltage (VBLP) terminal of FIG. 3 are illustrated in FIG. 5.

The voltage detecting unit 510 compares the reference voltage V_REF with the precharging voltage VBLP, which is a fed-back internal voltage, to output a detection signal DET. The voltage detecting unit 510 is enabled in response to an enable signal EN. The enable signal EN may contain information on the normal mode and the test mode.

The normal mode driving unit 530 may drive the precharging voltage (VBLP) terminal to the core voltage VCORE in response to the detection signal DET. The normal mode driving unit 530 may include a first PMOS transistor PM1 having a source connected to the core voltage (VCORE) terminal, a drain connected to the precharging voltage (VBLP) terminal, and a gate receiving the detection signal DET.

Since an operation of generating the precharging voltage VBLP in the normal mode is similar to that of the first embodiment, its detailed description will be omitted herein.

Next, the test mode driving unit 550 operated in the test mode will be described. The test mode driving unit 550 may include a pull-up driving unit 552 and a pull-down driving unit 554. As described above, in the test mode, the core test voltage TM_VCORE higher than the core voltage VCORE in the normal mode may be received through the core voltage (VCORE) terminal, and the first test voltage TM_V1 may be output through the precharging voltage (VBLP) terminal.

The pull-up driving unit 552 drives the precharging voltage (VBLP) terminal to the core test voltage TM_VCORE in response to the first control signal CTR1. The pull-up driving unit 552 may include a second PMOS transistor PM2 having a source connected to the core test voltage (TM_VCORE) terminal, a drain connected to the precharging voltage (VBLP) terminal, and a gate receiving the first control signal CTR1.

The pull-down driving unit 554 drives the precharging voltage (VBLP) terminal to the ground voltage VSS in response to the second control signal CTR2. The pull-down driving unit 554 may include a first NMOS transistor NM1 having a drain connected to the precharging voltage (VBLP) terminal, a source connected to the ground voltage (VSS) terminal, and a gate receiving the second control signal CTR2.

In this case, the first and second control signals CTR1 and CTR2 are signals generated similarly to the first embodiment of the invention. Thus, when the first control signal CTR1 is activated, the first test voltage TM_V1 is output corresponding to the core test voltage TM_VCORE. When the second control signal CTR2 is activated, the first test voltage TM_V1 is output corresponding to the ground voltage VSS.

Meanwhile, the semiconductor memory device in accordance with the second embodiment of the invention may include a cell plate voltage generator having a structure similar to that of the precharging voltage generator illustrated in FIG. 5. Like the first embodiment of the invention, when the precharging voltage generator generates the first test voltage TM_V1 corresponding to the core test voltage TM_VCORE, the cell plate voltage generator can generate the second test voltage TM_V2 corresponding to the ground voltage VSS. In addition, when the precharging voltage generator generates the first test voltage TM_V1 corresponding to the ground voltage VSS, the cell plate voltage generator can generate the second test voltage corresponding to the core test voltage TM_VCORE.

In accordance with the first and second embodiments of the invention, as described above, the first test voltage TM_V1 and the second test voltage TM_V2 applied to both terminals of the cell capacitor can be internally generated, without receiving them through the external pads. This means that the number of the external pads used in the test mode can be minimized and thus the test time can be reduced. Furthermore, the reduction in the test time can reduce the product cost and increase the product competitiveness.

While the invention has been described with respect to the specific embodiments, it will be apparent to those skilled in the art that various changes and modifications may be made without departing from the spirit and scope of the invention as defined in the following claims.

Moreover, the positions and kinds of the logic gates and transistors exemplified in the foregoing embodiments may be changed, depending on the polarities of the signals input thereto.

What is claimed is:

1. A semiconductor memory device having a normal mode and a test mode, comprising:
   a first internal voltage generator configured to generate a first internal voltage in the normal mode, and to generate a first test voltage by using a test power voltage in the test mode;
   a second internal voltage generator configured to generate a second internal voltage in the normal mode, and to generate a second test voltage by using the test power voltage in the test mode; and
   a memory cell configured to receive the first and second test voltages in the test mode.

2. The semiconductor memory device of claim 1, further comprising a test voltage pad configured to receive the test power voltage.

3. The semiconductor memory device of claim 1, wherein the memory cell includes:
   a cell transistor connected to a data line to transfer data; and
   a cell capacitor configured to store the data.

4. The semiconductor memory device of claim 3, wherein in the test mode of the device, the first test voltage is applied to an input terminal of the cell capacitor, and the second test voltage is applied to a cell plate voltage terminal of the cell capacitor.

5. The semiconductor memory device of claim 1, wherein each of the first and second internal voltage generators includes:
   a driving unit that receives a normal voltage or the test power voltage according to whether the device is in the normal mode or the test mode, and to drive respective output terminals of the first and second internal voltage generators to the normal voltage in the normal mode to output a corresponding internal voltage; and
   an enable control unit configured to enable the driving unit in response to a control signal corresponding to the test mode.

6. The semiconductor memory device of claim 5, wherein each of the first and second internal voltage generators further includes a voltage detecting unit configured to compare a target voltage level with a corresponding internal voltage fed back in the normal mode to output a detection signal.

7. The semiconductor memory device of claim 5, further including a decoding unit that decodes a test mode signal corresponding to the normal mode and the test mode to generate the corresponding control signal to the first and second internal voltage generators.

8. The semiconductor memory device of claim 7, further including a pad that receives the test mode signal.

9. The semiconductor memory device of claim 5, wherein the enable control unit outputs an enable signal for enabling the driving unit in response to the corresponding control signal in the test mode.

10. The semiconductor memory device of claim 9, wherein the driving unit performs a pull-up operation on the corresponding output terminals of the first and second internal voltage generators in response to the enable signal.

11. The semiconductor memory device of claim 5, further including a pull-down driving unit configured to perform a pull-down operation on the corresponding output terminals of the first and second internal voltage generators in response to the control signal.

12. The semiconductor memory device of claim 1, wherein each of the first and second internal voltage generators includes:
   a normal mode driving unit configured to receive a normal voltage to generate the corresponding internal voltage; and
   a test mode driving unit configured to receive the test power voltage to drive respective output terminals of the first and second internal voltage generators in response to a control signal corresponding to the test mode.

13. The semiconductor memory device of claim 12, wherein the test mode driving unit includes:
   a pull-up driving unit configured to pull up the corresponding output terminals of the first and second internal voltage generators in response to the control signal; and
   a pull-down driving unit configured to pull down the corresponding output terminals of the first and second internal voltage generators in response to the control signal.

* * * * *